United States Patent [19]

Kajiyama

[11] Patent Number: 5,431,163
[45] Date of Patent: Jul. 11, 1995

[54] MAGNETIC RESONANCE IMAGING METHOD AND APPARATUS

[75] Inventor: Koji Kajiyama, Kamagaya, Japan

[73] Assignee: Hitachi Medical Corporation, Tokyo, Japan

[21] Appl. No.: 161,398

[22] Filed: Dec. 6, 1993

[30] Foreign Application Priority Data

Dec. 10, 1992 [JP] Japan ................................ 4-329804

[51] Int. Cl.$^6$ ............................................. A61B 5/055
[52] U.S. Cl. ................... 128/653.2; 324/309
[58] Field of Search ...................... 128/653.2; 324/309, 324/307

[56] References Cited

U.S. PATENT DOCUMENTS 5,229,717 7/1993 Hinks ................................ 324/309
5,251,628 10/1993 Foo ................................. 128/653.2

*Primary Examiner*—Ruth S. Smith
*Attorney, Agent, or Firm*—Antonelli, Terry, Stout & Kraus

[57] ABSTRACT

A raw data space or k-space having a frequency encoding axis and a phase encoding axis orthogonal to each other are divided into three regions in the direction of the phase encoding axis which are composed of a central region and two side regions on both sides of the central region. The central region is occupied by one of an even-numbered echo group and an odd-numbered echo group, while each of the side regions is occupied by the other echo group. Thereby, artifacts are reduced which are caused by moving or flowing spins.

11 Claims, 8 Drawing Sheets

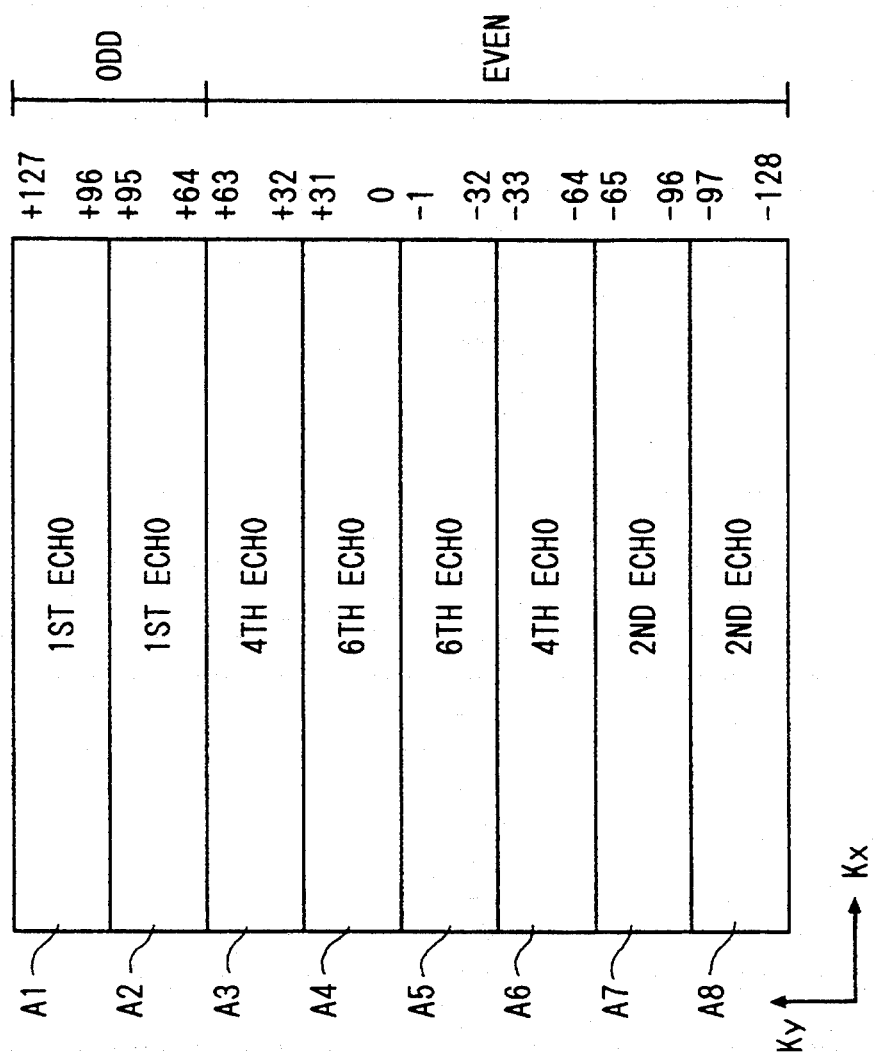

MAGNETIC RESONANCE IMAGING METHOD AND APPARATUS

BACKGROUND OF THE INVENTION

1. Field of the Invention

The present invention relates to a magnetic resonance imaging method and apparatus, and more particularly to a magnetic resonance imaging method and apparatus suitable for fast imaging of an object.

2. Description of the Prior Art

Magnetic resonance imaging technology is applied to the obtaining of sectional images of an object by utilizing a nuclear magnetic resonance phenomenon and is well known as what is useful for examining the human body.

A fast imaging method called "RARE" is disclosed in Magnetic Resonance in Medicine 3, 823–833 (1986). According to the fast imaging method, a number of echoes resulting from repeatedly applying a 180° radio frequency pulse to the object after it is excited with a 90° radio frequency pulse are differently phase-encoded, whereby one image is reconstructed. Typically, 128 or 256 echoes are employed to reconstruct one image. Accordingly, the time required for imaging is reduced to 1/n (n:the number of echoes to be used) as compared with what is required in any conventional spin echo method in which the excitation is needed 128 or 256 times to obtain 128 or 256 projections necessary for one image to be reconstructed. Since the magnitude of echoes is exponentially decreased in accordance with transverse relaxation time (T2) characteristics, however, the image obtained through this method tends to become significantly different in quality from what is obtained through the ordinary spin echo method.

A so-called multishot RARE method has been proposed to make such a problem less serious. With this method, the number of echoes is set to be smaller than that of projections. According to this method, however, artifacts are caused in a phase encoding direction by motion or flow of spins, resulting in the degradation of image quality of the object.

SUMMARY OF THE INVENTION

An object of the present invention is to provide a magnetic resonance imaging method and apparatus suitable for fast imaging of an object.

Another object of the present invention is to provide a magnetic resonance imaging method and apparatus capable of reducing motion or flow artifacts in a phase encoding direction.

Yet another object of the invention is to provide a magnetic resonance imaging method and apparatus capable of producing an image of an object which is minimally affected by motion or flow of spins.

According to an aspect of the present invention, a static magnetic field is generated in which an object is disposed, the object is so excited that a plurality of echoes are generated repeatedly. The generated echoes are phase-encoded and read out so that one of at least one even-numbered echo of the generated echoes and at least one odd-numbered echo thereof is assigned to a central region of a raw data space in the direction of a phase encoding axis thereof and the other of the at least one even-numbered echo of the generated echoes and the at least one odd numbered echo thereof is assigned to each of the remaining regions of the raw data space on both sides of the central region in the direction of the phase encoding axis. An image of the object is produced on the basis of the assigned echoes to the raw data space.

According to another aspect of the present invention, the object is so excited that at least four echoes including at least two even-numbered echoes are repeatedly generated. The generated echoes are phase-encoded and read out so that a plurality of even-numbered echoes of the generated echoes are caused to cover the whole of a raw data space having a frequency encoding axis and a phase encoding axis orthogonal to each other. Therefore, an image of the object is produced on the basis of the even-numbered echoes assigned to the whole of the raw data space.

According to yet another aspect of the present invention, the generated echoes are phase-encoded and read out so that one of at least one even-numbered echo of the generated echoes and at least one odd-numbered echo thereof is assigned to one of two regions into which the whole of a raw data space is imaginarily divided in a phase encoding axis thereof and the other of the at least one even-numbered echo of the generated echoes and the at least one odd-numbered echo thereof is assigned to the other of the two regions.

These and other objects and features of the present invention will become apparent from the descriptions of preferred embodiments of the present invention taken in connection with the accompanying drawings.

BRIEF DESCRIPTION OF THE DRAWINGS

FIG. 8 is a yet another echo arrangement in a raw data space according to the present invention.

DESCRIPTION OF THE PREFERRED EMBODIMENTS

Figure 1:
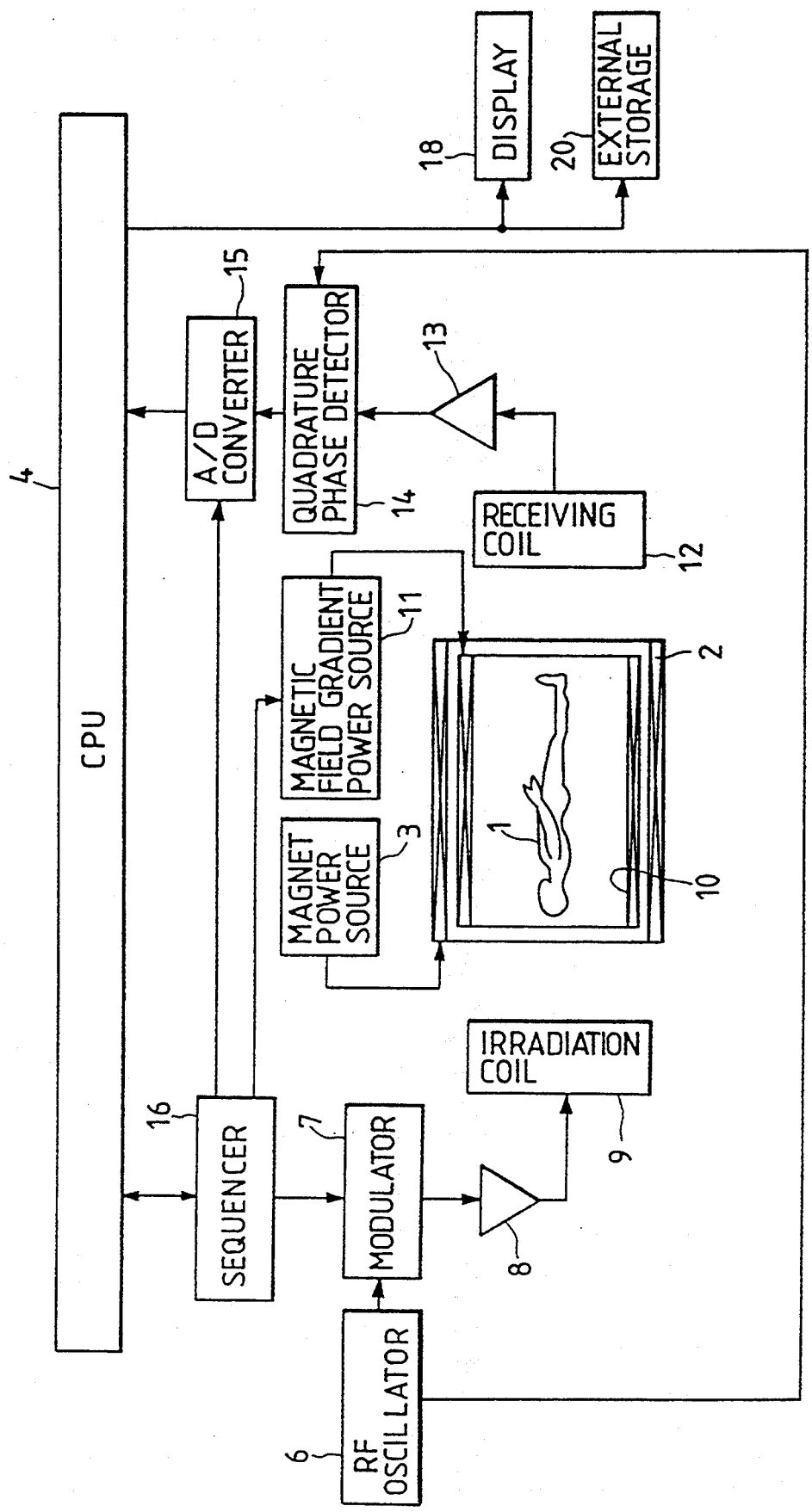
FIG. 1 is a block diagram schematically illustrating a magnetic resonance imaging apparatus of an embodiment according to the present invention.

Referring to FIG. 1, an object 1 to be examined is disposed in a uniform static magnetic field generated by a magnet 2, which is energized by a magnet power source 3. Although the magnet 2 is shown to be of a superconductive or resistive type in FIG. 1, it may be a permanent magnet. A radio frequency generated by a radio frequency oscillator 6 is modulated by a modulator 7 so that it may be pulsed and what is thus pulsed is amplified by an amplifier 8 before being applied through an irradiation coil 9 to the object 1, which is thereby subjected to nuclear magnetic resonance excitation so as to generate a nuclear magnetic resonance signal. A magnetic field gradient coil unit 10 is driven by a magnetic field gradient power source 11 so as to cause the static magnetic field to have magnetic field gradients in the directions of X, Y and Z. The nuclear magnetic resonance signal is detected by a receiving coil 12 and amplified by an amplifier 13. The amplified signal is phase-detected by a quadrature phase detector 14 with the radio frequency from the radio frequency oscillator 6 as a reference signal, further digitized by an A/D converter 15 and then introduced into a processing unit 4.

A sequencer 16 is connected to the modulator 7, the magnetic field gradient power source 11 and the A/D converter 15, and controls the generation of the radio frequency pulses and the magnetic field gradient pulses in the directions of X, Y and Z and the A/D conversion of the signal from the quadrature phase detector 14 under the control of the central processing unit 4.

The signal introduced into the central processing unit 4 goes through a Fourier transform process for image reconstruction and an image of the object 1 which is thereby obtained is displayed on a display 18 and recorded in an external storage 20 which may be a magnetic disk or optical disk.

Figure 2:
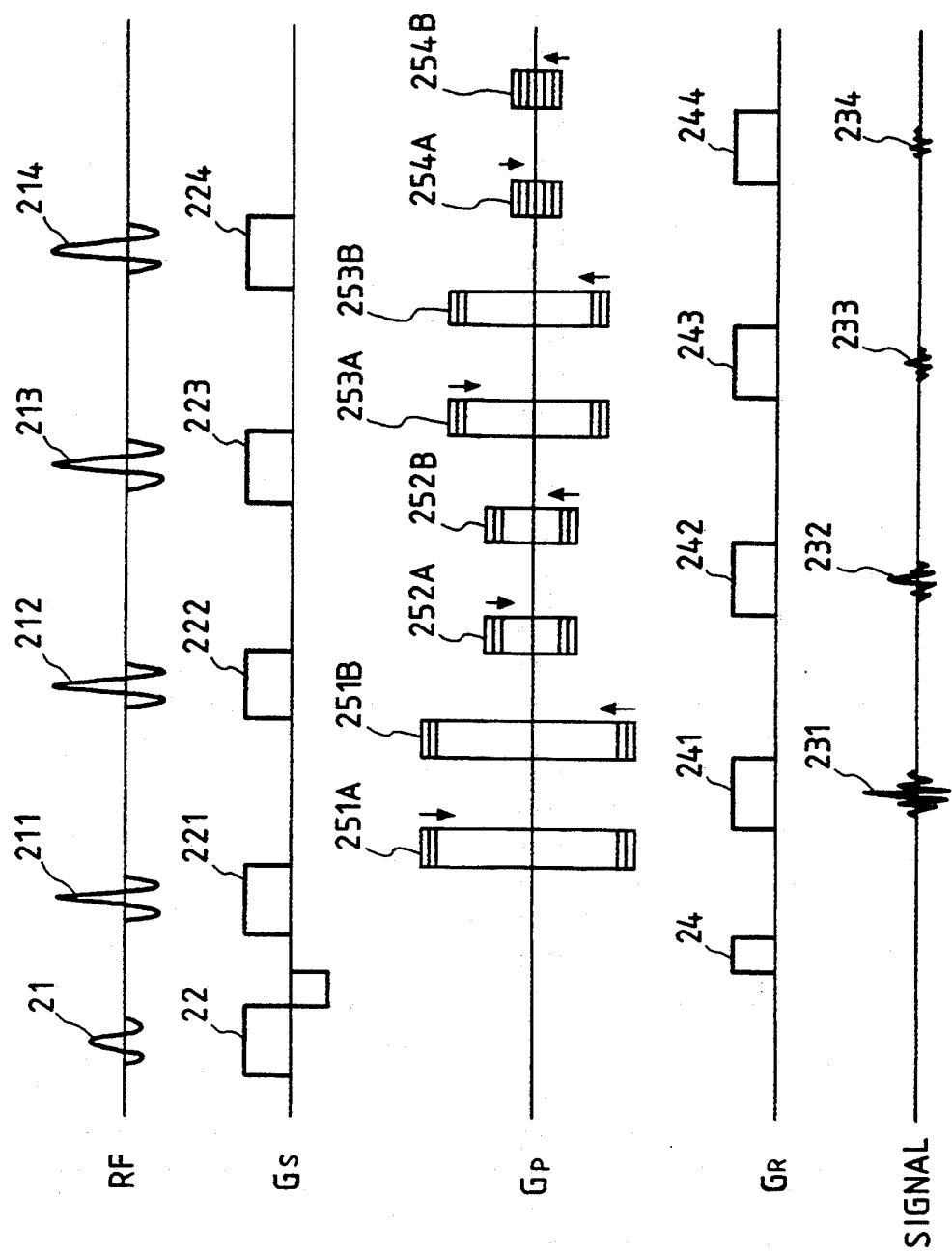
FIG. 2 is a pulse sequence according to the present invention for use in the embodiment shown in FIG. 1.

Referring to FIG. 2, a selective 90° radio frequency pulse RF21 is applied in the presence of a magnetic field gradient pulse Gs22 for slice selection. Consequently, a slice perpendicular to the direction in which the magnetic field gradient pulse Gs22 for slice selection is applied is selectively excited. In other words, nuclear spins in the selected slice are tipped by 90° in a rotating frame of reference. The tipped spins are gradually dispersed.

Subsequently, a selective 180° radio frequency pulse RF211 is applied in the presence of a magnetic field gradient pulse Gs221 for slice selection, whereby the tipped spins are inverted and the gradually dispersed spins are caused to converge gradually. As a result, an echo 231 as a nuclear magnetic resonance signal is generated from the whole slice. It is assumed that TE/2 is a time interval between the selective 90° radio frequency pulse RF21 and the selective 180° radio frequency pulse RF211. After the selective 180° radio frequency pulse RF211 is applied, selective 180° radio frequency pulses RF212-RF214 are applied at time intervals of TE in the presence of the magnetic field gradient pulses Gs222-Gs224, respectively. As a result, echoes 232-234 are generated TE/2 after the respective selective 180° radio frequency pulses are applied. With respect to the order in which the echoes 231-234 are generated, they are called the first, second, third and fourth echoes, respectively. The first, second, third and fourth echoes 231-234 are read out in the presence of magnetic field gradient pulses Gr241-Gr244 for readout and sampled, respectively. The magnetic field gradient pulses Gr241-Gr244 are also called frequency encoding magnetic field gradient pulses. A magnetic field gradient pulse 24 is applied for causing the spins to rephase.

The pulse sequence shown in FIG. 2 is repeated and magnetic field gradient pulses Gp251A-Gp254A for phase encoding are applied at this time to cause the first to fourth echoes 241-244 differently phase-encoded. The echoes read out by the repeating of the pulse sequence like this are assigned to regions of a raw data space (which is generally called a k-space) in the direction of a phase encoding axis. Magnetic field gradient pulses Gp251B-Gp254B are applied for rephasing the dephased spins by applying the phase encoding magnetic field gradient pulses Gp251A-Gp254A, respectively.

In general, the magnetic field gradient pulses Gs, Gr and Gp are applied in the direction of the Z, X and Y axes, respectively.

Figure 3B:
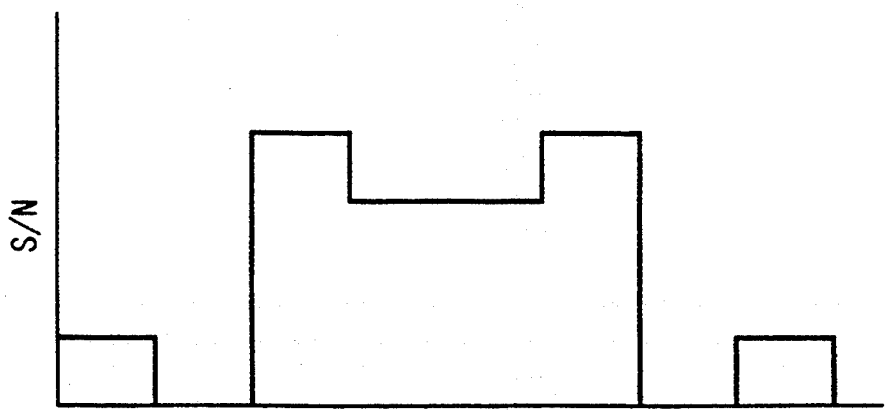
FIG. 3B is a graph illustrating a signal-to-noise ratio characteristic of echoes obtained from moving or flowing spins in the case where the echoes are arranged as shown in FIG. 3A.
Figure 3A:
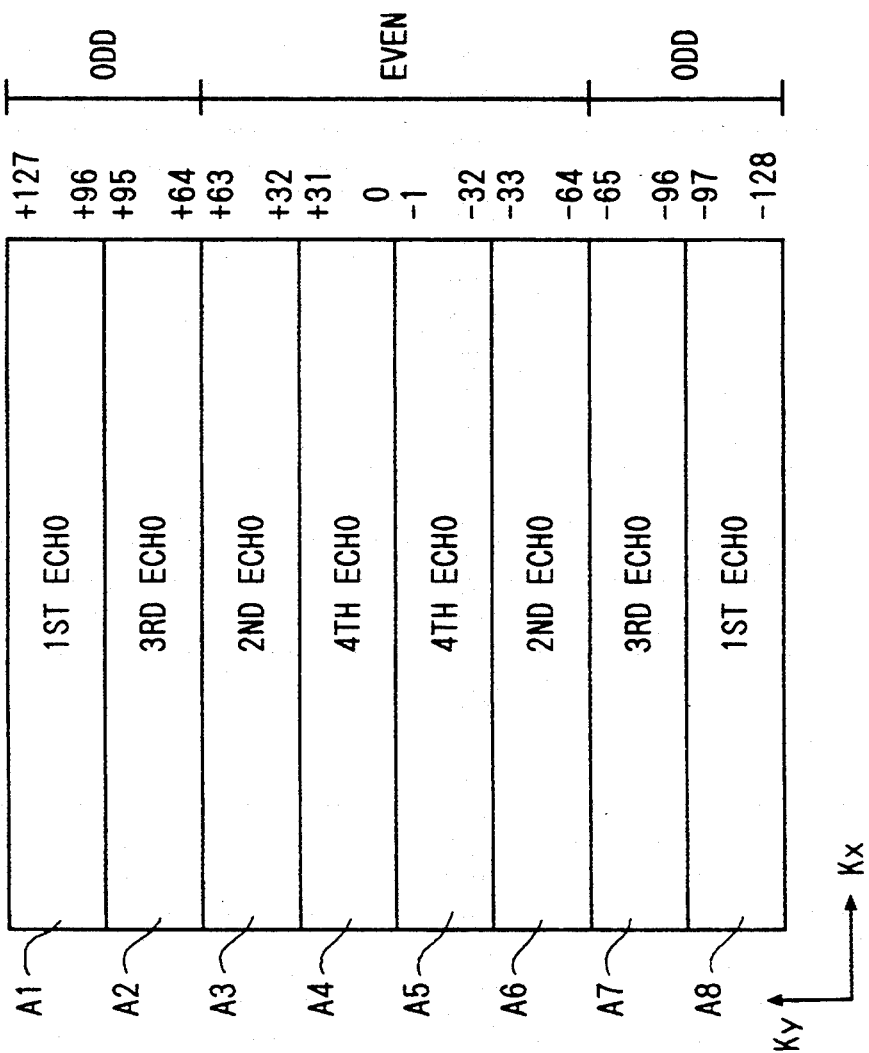
FIG. 3A is a diagram showing an echo arrangement in a raw data space according to the present invention.

FIG. 3A shows an echo arrangement in a raw data space according to the present invention. The raw data space is usually called a k-space and has a frequency encoding axis Kx and a phase encoding axis Ky orthogonal to each other as shown in FIG. 3A. Numbers of 256 from $+127$ to $-128$ will be referred to as phase encoding numbers for convenience sake. The raw data space may be also called a digital data storing space for storing digital data of the read out echoes and in FIG. 3A is imaginarily divided into eight regions from a region A1 to a region A8 in the direction of the phase encoding axis Ky to assign the first, third, second, fourth, fourth, second, third and first echoes to those regions in the same order. The phase encoding magnetic field gradient pulses Gp251A-Gp254A are so set as to obtain the echo arrangement shown in FIG. 3A, which is obtained by exciting 64 times the object 1 and, during repeating excitation, phase-encoding the first, second, third and fourth echoes as shown in the following table:

TABLE 1

| Excitation steps | 1st echo | 2nd echo | 3rd echo | 4th echo |
| --- | --- | --- | --- | --- |
| 1st | +127 | +63 | +95 | +31 |
| 2nd | +126 | +62 | +94 | +30 |
| • | • | • | • | • |
| • | • | • | • | • |
| 31st | +97 | +33 | +65 | +1 |
| 32nd | +96 | +32 | +64 | 0 |
| 33rd | −97 | −33 | −65 | −1 |
| 34th | −98 | −34 | −66 | −2 |
| • | • | • | • | • |
| • | • | • | • | • |
| 63rd | −127 | −63 | −95 | −31 |
| 64th | −128 | −64 | −96 | −32 |

Figure 4B:
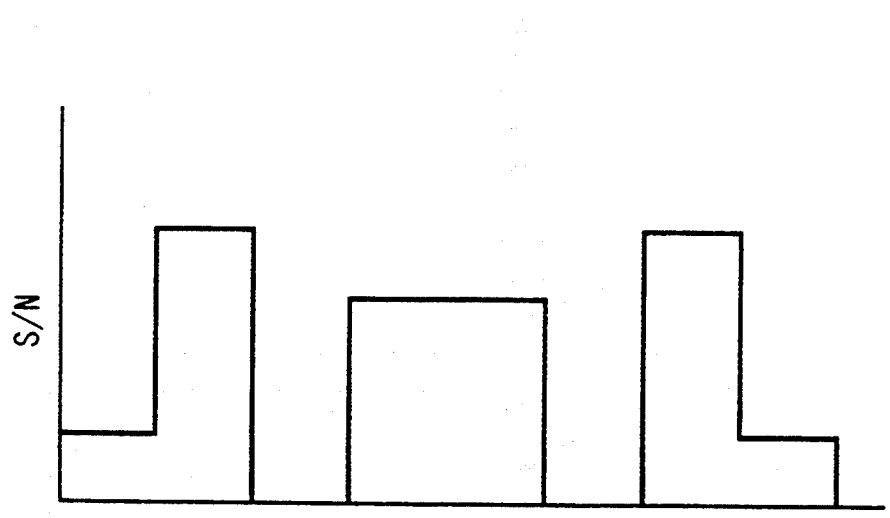
FIG. 4B is a graph illustrating a signal-to-noise ratio characteristic of echoes obtained from moving or flowing spins in the case where the echoes are arranged as shown in FIG. 4A.
Figure 4A:
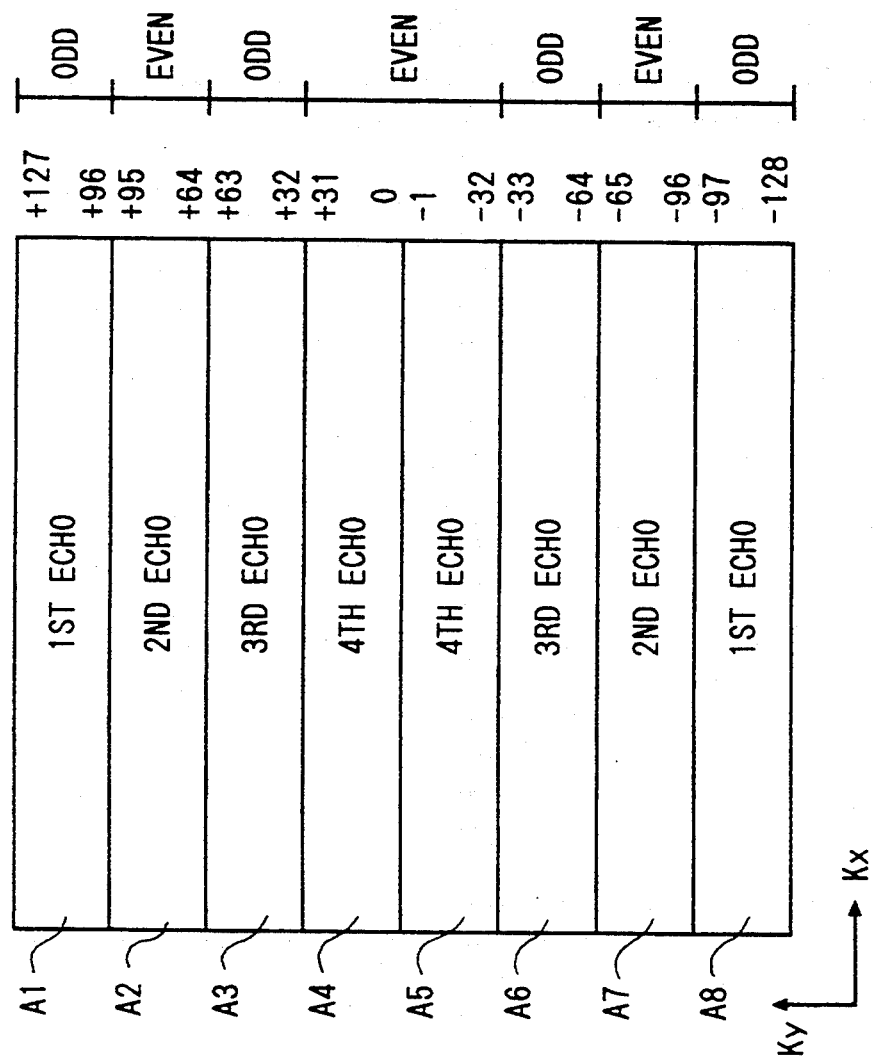
FIG. 4A is a diagram showing a conventional echo arrangement in a raw data space.

FIG. 4A shows a conventional echo arrangement in a raw data space. In FIG. 4A, the first, second, third, fourth, fourth, third, second and first echoes are assigned to the regions A1 to A8 in the same order.

FIGS. 3B and 4B show signal-to-noise ratio characteristics obtained by using the echo arrangements of FIGS. 3A and 4A with respect to moving or flowing spins.

Referring to FIG. 3A, the raw data space is imaginarily divided into three region groups. One of these groups is an even-numbered echo region group composed of the regions A3 to A6 which occupies a central portion of the raw image data space in the direction of the phase encoding axis thereof, and the remainder are two odd-numbered echo region groups which occupy the regions A1 and A2 on one side of the central portion of the raw data space in the direction of the phase encoding axis thereof and the regions A7 and A8 on the other side of the central portion of the raw data space in the direction of the phase encoding axis thereof, respectively. On the other hand, the raw data space in FIG. 4A consists of three even-numbered region groups which are composed of a group occupying the regions A4 and A5, a group occupying the region A2 and a group occupying the region A7 and four odd-numbered region groups which are composed of groups occupying the regions A1, A3, A6 and A8, respectively.

It is understood from FIGS. 3B and 4B that the even-numbered echoes cause the signal-to-noise ratio thereof to increase as distinct from the case of the odd-numbered echoes, the reason for which will be discussed later. In addition, it is also understood from FIGS. 3B and 4B that the signal-to-noise ratio characteristic of the even-numbered echoes forms a substantially single rectangular wave in the case of the echo arrangement of the FIG. 3A because the odd-numbered echo is not interposed between the even-numbered echoes and forms three rectangular waves, in the case of the echo arrangement of FIG. 4A because the even-echo numbered echoes are arranged with the odd-numbered echo interposed therebetween, respectively. As a result, when being Fourier-transformed in the phase encoding direction, the substantially single rectangular wave and the three rectangular waves are converted into a single Sinc function signal and three Sinc function signals, respectively, which are displayed in superposition on the image of the object due to desired still spins thereof as motion or flow artifacts in a striped pattern in the phase encoding direction. However, the distance between the stripes according to the echo arrangement of FIG. 3A is increased as compared with that according to the echo arrangement of FIG. 4B. Furthermore, the stripes are lighter in color in the case of FIG. 3A than in the case of FIG. 4A. Thus, the artifacts according to FIG. 3A are much less conspicuous than those according to FIG. 4A.

The signal-to-noise ratio of the first echo in FIG. 3B and 4B has not been discussed for the sake of facilitating understanding of the invention.

The time required for imaging can be reduced by increasing the number of the echoes to be used, while in this case artifacts are increased. The example of the invention is especially effective in such a case.

Figure 5:
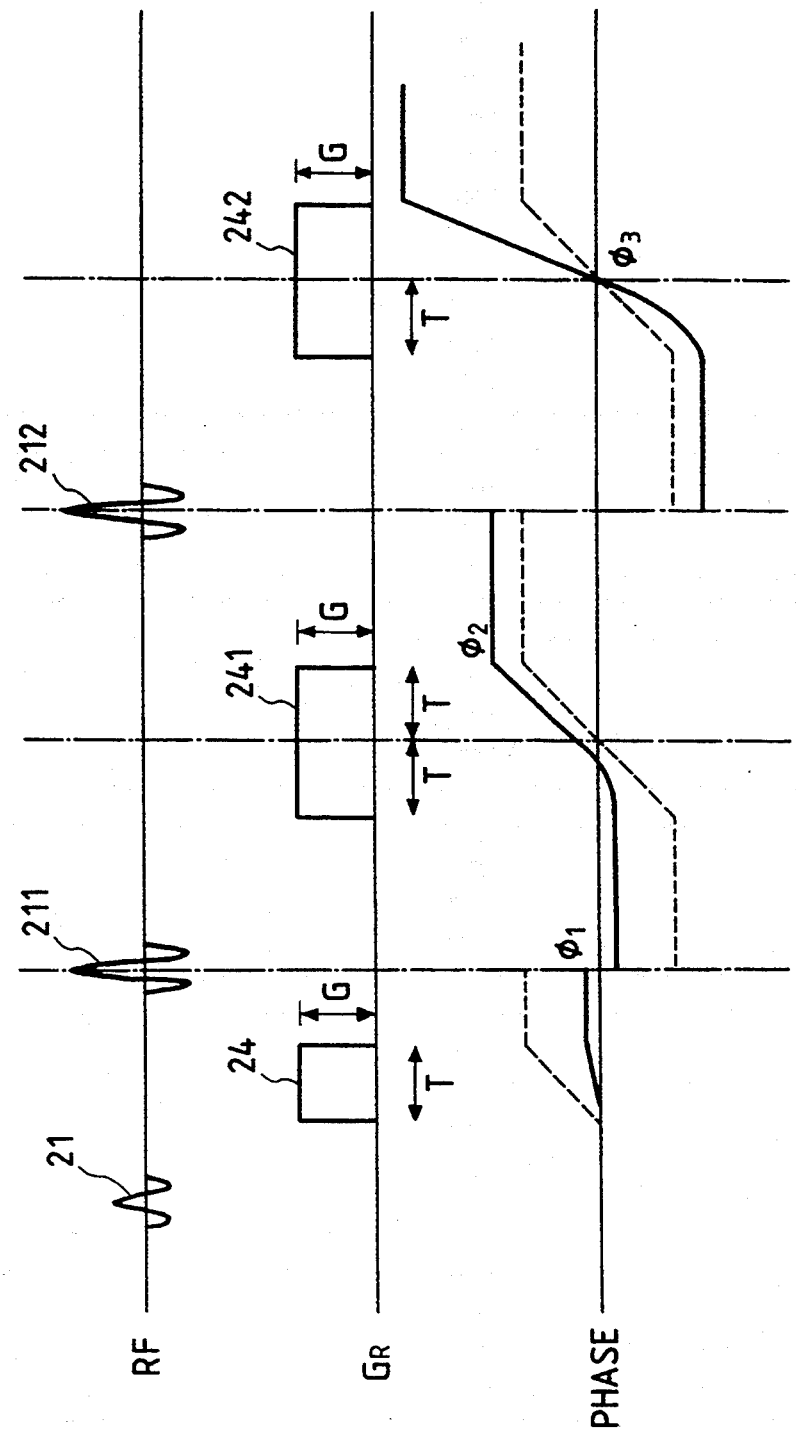
FIG. 5 is an illustration for explaining phase differences of spins between even-numbered and odd-numbered echoes.

As far as moving or flowing spins are concerned, the signal-to-noise ratio of the even-numbered echoes is higher than that of the odd-numbered echoes. This phenomenon can be called "even-numbered echo rephasing". The reason why the phenomenon occurs will be explained with reference to FIG. 5, wherein the change of phase of still spins in the object is shown with dotted lines and that of moving or flowing spins in the object is shown with solid lines.

The change of phase of still spins will be explained prior to the explanation of that of moving or flowing spins. When spins existing at the position of x in the frequency encoding direction is excited by applying the selective 90° radio frequency pulse RF21, the spins are tipped by 90° and gradually dispersed. The angular frequency $\omega$ of the spins when the magnetic field gradient pulse is applied are given by the following equation:

$$\omega = \gamma \cdot G \cdot x$$

where $\gamma$ is a constant and G is the magnitude of each of the magnetic field gradient pulses Gr24, GR241 and Gr242 in the frequency encode direction. The phase of the spins just after the magnetic field gradient pulse Gr24 is applied is given as follows:

$$\phi = \int \omega \cdot dt = \gamma \cdot G \cdot x \cdot T$$

where T is the length of time of the magnetic field gradient pulse Gr24 which is equal to a half of that of each of the magnetic field gradient pulses Gr241 and GR242.

Incidentally, the magnetic field gradient pulses 243 and 244 shown in FIG. 2 are the same in magnitude and width as the magnetic field gradient pulses 241 and 242.

The phase of the spins are inverted by applying the selective 180° radio frequency pulse RF211 and becomes zero when the first echo 231 is read by applying the magnetic field gradient pulse Gr241. Similarly, the phase of the spins becomes zero when the echoes 232 to 234 are read by applying the magnetic field gradient Gr242 to Gr244, respectively.

Subsequently, the change of phase of spins moving or flowing in the frequency encoding direction will be explained. It is assumed that the spins move or flow with velocity v in the phase encoding direction only when the magnetic field gradients Gr are applied. It is further assumed that $\phi_1$ is the phase of the spins after magnetic field gradient pulse Gr24 is applied, $\phi_2$ is the phase of the spins after the magnetic field gradient pulse Gr241 is applied and $\phi_3$ is the phase of the spins after the magnetic field gradient pulse Gr242 is applied.

When the magnetic field gradient pulse Gr24 is applied after the application of the selective 90° radio frequency pulse RF21, the spins move from a starting position $x_0 = 0$ to a position x after the time length T. In this case, the position x is expressed as follows:

$$x = v \cdot T$$

Therefore, the phase $\phi_1$ is given as follows:

$$\phi_1 = \tfrac{1}{2} \cdot \gamma \cdot G \cdot (v \cdot T)^2$$

Namely, the phase $\phi_1$ is proportional to the square of the time length. Similarly, the phase $\phi_2$ is given as follows:

$$\phi_2 = \tfrac{1}{2} \cdot \gamma \cdot G \cdot (v \cdot T + 3 \cdot v \cdot T) \cdot 2 - \phi_1 = 7/2 \cdot \gamma \cdot G \cdot (v \cdot T)^2$$

The phase $\phi_2$ is a function of the velocity and therefore, the spins different in velocity from each other give rise to artifacts. Similarly, the phase is given as follows:

$$\phi_3 = \tfrac{1}{2} \cdot \gamma \cdot G \cdot (3 \cdot v \cdot T + 4 \cdot v \cdot T) - \phi_2 = 0$$

It is understood from the equation that the phase $\phi_3$ becomes zero irrespective of the velocity and thus artifacts are not caused with respect to the second echo.

In general, the strength Gp of the phase encoding magnetic field gradient pulse is expressed as follows:

$$Gp = 2 \cdot \pi / \gamma \cdot t \cdot FOV$$

where t is the time width of the phase encoding magnetic field gradient pulse and FOV is the length of one side of the imaging field of view in the phase encoding the phase encoding axis thereof, and the remainder are two odd-numbered echo region groups which occupy the regions A1 and A2 on one side of the central portion of the raw data space in the direction of the phase encoding axis thereof and the regions A7 and A8 on the other side of the central portion of the raw data space in the direction of the phase encoding axis thereof, respectively. On the other hand, the raw data space in FIG. 4A consists of three even-numbered region groups which are composed of a group occupying the regions A4 and A5, a group occupying the region A2 and a group occupying the region A7 and four odd-numbered region groups which are composed of groups occupying the regions A1, A3, A6 and A8, respectively.

It is understood from FIGS. 3B and 4B that the even-numbered echoes cause the signal-to-noise ratio thereof to increase as distinct from the case of the odd-numbered echoes, the reason for which will be discussed later. In addition, it is also understood from FIGS. 3B and 4B that the signal-to-noise ratio characteristic of the even-numbered echoes forms a substantially single rectangular wave in the case of the echo arrangement of the FIG. 3A because the odd-numbered echo is not interposed between the even-numbered echoes and forms three rectangular waves, in the case of the echo arrangement of FIG. 4A because the even-echo numbered echoes are arranged with the odd-numbered echo interposed therebetween, respectively. As a result, when being Fourier-transformed in the phase encoding direction, the substantially single rectangular wave and the three rectangular waves are converted into a single Sinc function signal and three Sinc function signals, respectively, which are displayed in superposition on the image of the object due to desired still spins thereof as motion or flow artifacts in a striped pattern in the phase encoding direction. However, the distance between the stripes according to the echo arrangement of FIG. 3A is increased as compared with that according to the echo arrangement of FIG. 4B. Furthermore, the stripes are lighter in color in the case of FIG. 3A than in the case of FIG. 4A. Thus, the artifacts according to FIG. 3A are much less conspicuous than those according to FIG. 4A.

The signal-to-noise ratio of the first echo in FIG. 3B and 4B has not been discussed for the sake of facilitating understanding of the invention.

The time required for imaging can be reduced by increasing the number of the echoes to be used, while in this case artifacts are increased. The example of the invention is especially effective in such a case.

As far as moving or flowing spins are concerned, the signal-to-noise ratio of the even-numbered echoes is higher than that of the odd-numbered echoes. This phenomenon can be called "even-numbered echo rephasing". The reason why the phenomenon occurs will be explained with reference to FIG. 5, wherein the change of phase of still spins in the object is shown with dotted lines and that of moving or flowing spins in the object is shown with solid lines.

The change of phase of still spins will be explained prior to the explanation of that of moving or flowing spins. When spins existing at the position of x in the frequency encoding direction is excited by applying the selective 90° radio frequency pulse RF21, the spins are tipped by 90° and gradually dispersed. The angular frequency $\omega$ of the spins when the magnetic field gradient pulse is applied are given by the following equation:

$$\omega = \gamma \cdot G \cdot x$$

where $\gamma$ is a constant and G is the magnitude of each of the magnetic field gradient pulses Gr24, GR241 and Gr242 in the frequency encode direction. The phase of the spins just after the magnetic field gradient pulse Gr24 is applied is given as follows:

$$\phi = \int \omega \cdot dt = \gamma \cdot G \cdot x \cdot T$$

where T is the length of time of the magnetic field gradient pulse Gr24 which is equal to a half of that of each of the magnetic field gradient pulses Gr241 and GR242.

Incidentally, the magnetic field gradient pulses 243 and 244 shown in FIG. 2 are the same in magnitude and width as the magnetic field gradient pulses 241 and 242.

The phase of the spins are inverted by applying the selective 180° radio frequency pulse RF211 and becomes zero when the first echo 231 is read by applying the magnetic field gradient pulse Gr241. Similarly, the phase of the spins becomes zero when the echoes 232 to 234 are read by applying the magnetic field gradient Gr242 to Gr244, respectively.

Subsequently, the change of phase of spins moving or flowing in the frequency encoding direction will be explained. It is assumed that the spins move or flow with velocity v in the phase encoding direction only when the magnetic field gradients Gr are applied. It is further assumed that $\phi_1$ is the phase of the spins after magnetic field gradient pulse Gr24 is applied, $\phi_2$ is the phase of the spins after the magnetic field gradient pulse Gr241 is applied and $\phi_3$ is the phase of the spins after the magnetic field gradient pulse Gr242 is applied.

When the magnetic field gradient pulse Gr24 is applied after the application of the selective 90° radio frequency pulse RF21, the spins move from a starting position $x_0 = 0$ to a position x after the time length T. In this case, the position x is expressed as follows:

$$x = v \cdot T$$

Therefore, the phase $\phi_1$ is given as follows:

$$\phi_1 = \tfrac{1}{2} \cdot \gamma \cdot G \cdot (v \cdot T)^2$$

Namely, the phase $\phi_1$ is proportional to the square of the time length. Similarly, the phase $\phi_2$ is given as follows:

$$\phi_2 = \tfrac{1}{2} \cdot \gamma \cdot G \cdot (v \cdot T + 3 \cdot v \cdot T) \cdot 2 - \phi_1 = 7/2 \cdot \gamma \cdot G \cdot (v \cdot T)^2$$

The phase $\phi_2$ is a function of the velocity and therefore, the spins different in velocity from each other give rise to artifacts. Similarly, the phase is given as follows:

$$\phi_3 = \tfrac{1}{2} \cdot \gamma \cdot G \cdot (3 \cdot v \cdot T + 4 \cdot v \cdot T) - \phi_2 = 0$$

It is understood from the equation that the phase $\phi_3$ becomes zero irrespective of the velocity and thus artifacts are not caused with respect to the second echo.

In general, the strength Gp of the phase encoding magnetic field gradient pulse is expressed as follows:

$$Gp = 2 \cdot \pi / \gamma \cdot t \cdot FOV$$

where t is the time width of the phase encoding magnetic field gradient pulse and FOV is the length of one side of the imaging field of view in the phase encoding direction. Accordingly, with respect to the m-th data on the raw data space, the following equation is formed:

$$Gpm = 2\cdot\pi\cdot m/\gamma\cdot t\cdot FOV$$

Figure 6B:
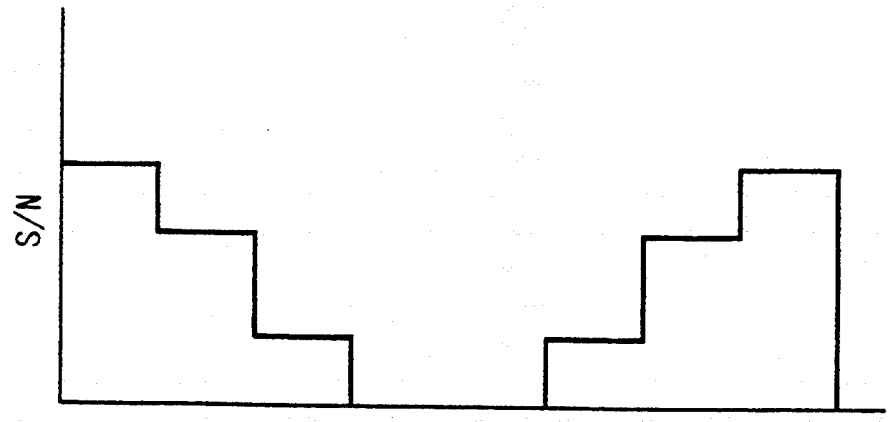
FIG. 6B is a graph illustrating a signal-to-noise ratio characteristic of echoes obtained from moving or flowing spins in the case where the echoes are arranged as shown in FIG. 6A.
Figure 6A:
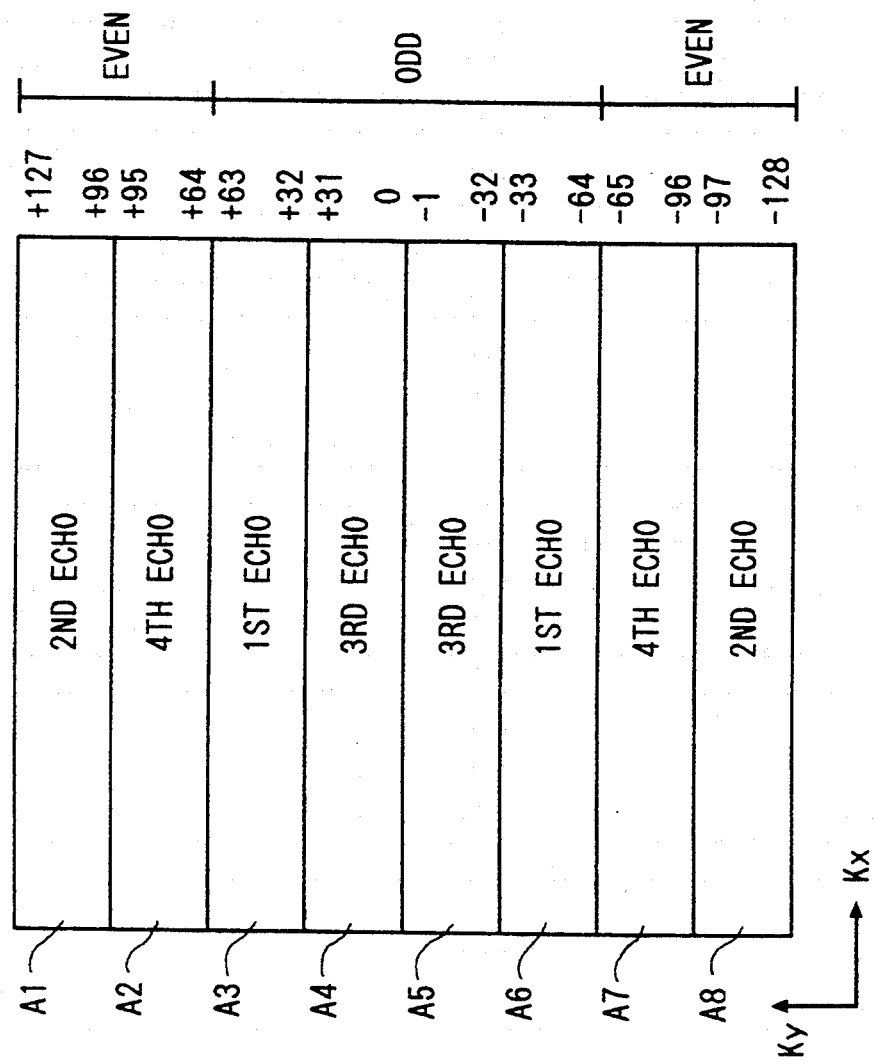
FIG. 6A is another echo arrangement in a raw image data space according to the present invention.

FIG. 6A shows another echo arrangement according to the invention. The odd-numbered echoes are assigned to an odd-numbered echo region group composed of the regions A3 to A6 which occupies a central portion of the raw data space in the phase encoding direction, while the even-numbered echoes are assigned to two even-numbered echo region groups which occupy the regions A1 and A2 on one side of the central portion of the raw data space in the phase encoding direction thereof and the regions A7 and A8 on the other side of the central portion of the raw data space in the phase encoding direction, respectively. A signal-to-noise ratio characteristic obtained from moving or flowing spins by using the echo arrangement of FIG. 6A is shown in FIG. 6B. The echo arrangement of FIG. 6A is as effective as that of FIG. 3A.

Figure 7B:
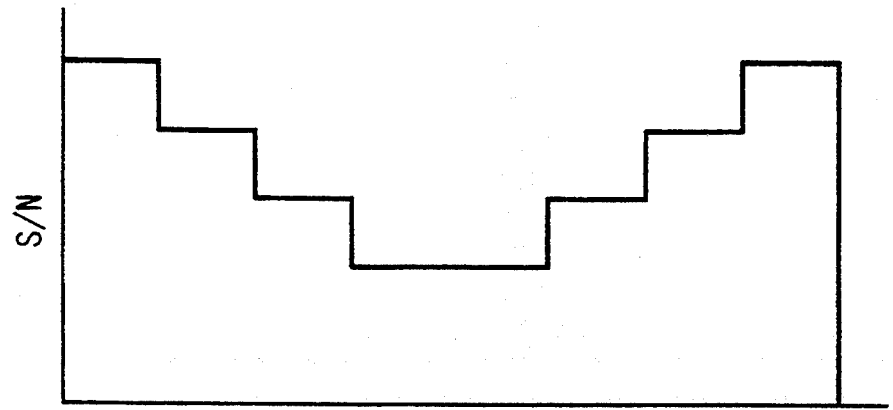
FIG. 7B is a graph illustrating a signal-to-noise ratio characteristic of echoes obtained from moving or flowing spins in the case where the echoes are arranged as shown in FIG. 7A.
Figure 7A:
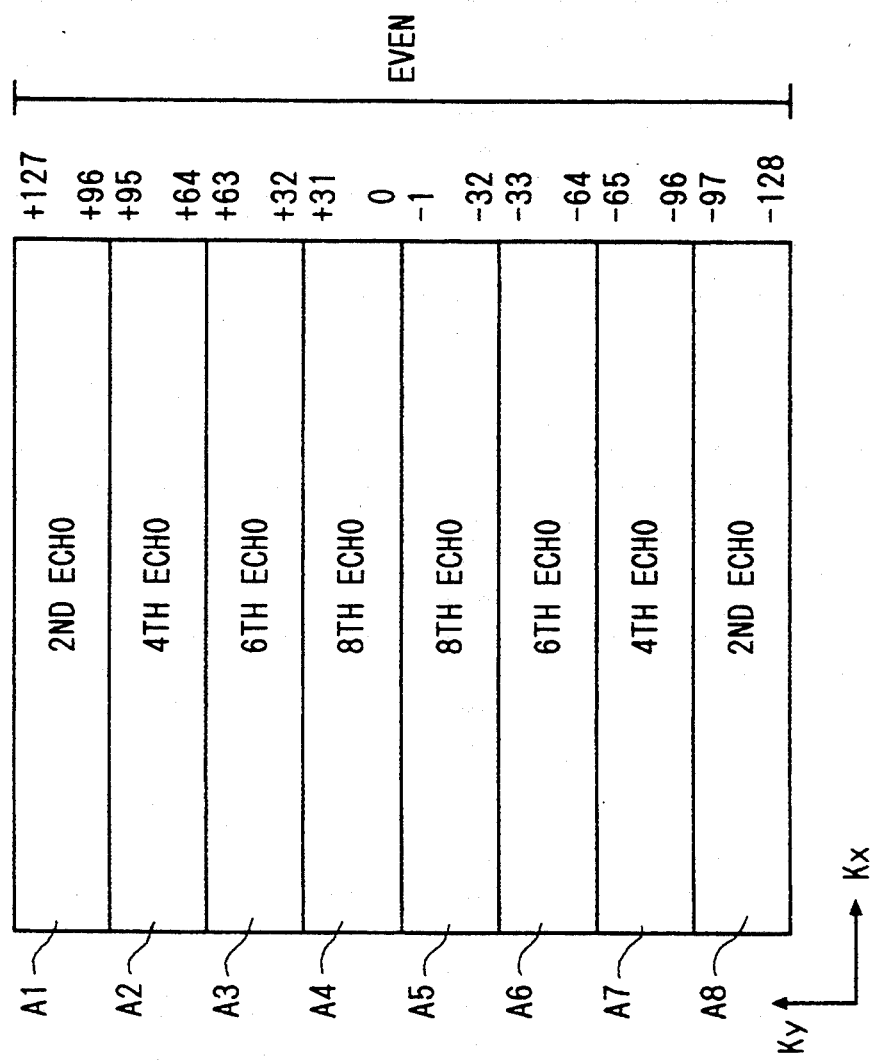
FIG. 7A is an additional echo arrangement in a raw data space according to the present invention.

FIG. 7A shows an additional echo arrangement according to the invention in which the whole of the raw data space is occupied or covered by the even-numbered echoes. A signal-to-noise ratio obtained from moving or flowing spins by using the echo arrangement of FIG. 7A is shown in FIG. 7B.

Four echoes including two even-numbered echoes may be generated even though eight echoes are shown as generated in FIG. 7A;

FIG. 8 shows a yet another echo arrangement according to the invention. A signal-to-noise ratio characteristic due to this echo arrangement is omitted for the sake of simplification.

The echo arrangements of FIGS. 7A and 8 are also as effective as that of FIG. 3A. Since it is obvious that changes and modifications can be made in the above described details without departing from the nature and spirit of the invention, it is to be understood that the invention is not to be limited to the detailed described herein.

What is claimed is:

1. A magnetic resonance imaging method, which comprises the steps of:
   (1) generating a static magnetic field in which an object is disposed;
   (2) exciting the object so that a plurality of echoes are repeatedly generated;
   (3) phase-encoding and reading out the generated echoes so as to assign one of even-numbered echoes of the generated echoes and odd-numbered echoes thereof only to a central region of a raw data apace in the direction of a phase encoding axis thereof and to assign the other of the even-numbered echoes of the generated echoes and the odd-numbered echoes thereof only to each of the remaining regions of the raw data space on both sides of the central region in the direction of the phase encoding axis; and (4) producing an image of the object on the basis of the assigned echoes to the raw data space.

2. A magnetic resonance imaging method according to claim 1, wherein the object exciting step includes repeatedly applying an excitation radio frequency pulse and a plurality of succeeding inversion radio frequency pulses to the object.

3. A magnetic resonance imaging method according to claim 2, wherein the excitation radio frequency pulse is a 90° radio frequency pulse and each of the inversion radio frequency pulses is a 180° radio frequency pulse.

4. A magnetic resonance imaging method according to claim 1, wherein the even-numbered echoes are assigned only to the central region and the odd-numbered echoes are assigned only to the remaining regions.

5. A magnetic resonance imaging method according to claim 1, wherein the odd-numbered echoes are assigned only to the central region and the even-numbered echoes are assigned only to the remaining regions.

6. A magnetic resonance imaging method, which comprises the steps of:
   (1) generating a static magnetic field in which an object is disposed;
   (2) exciting the object to repeatedly generate a plurality of echoes;
   (3) phase-encoding and reading out the generated echoes to assign one of even-numbered echoes of the generated echoes and odd-numbered echoes thereof only to one of two regions into which the whole of a raw data space is imaginarily divided in a phase encoding axis thereof and to assign the other of the even-numbered echoes of the generated echoes and the odd-numbered echoes thereof only to the other of the two regions; and (4) producing an image of the object on the basis of the assigned echoes to the raw data space.

7. A magnetic resonance imaging method according to claim 6, wherein the object exciting step includes repeatedly applying an excitation radio frequency pulse and a plurality of succeeding inversion radio frequency pulses to the object.

8. A magnetic resonance imaging apparatus, which comprises:
   (1) means for generating a static magnetic field in which an object is disposed;
   (2) means for repeatedly applying an excitation radio frequency pulse and a plurality of succeeding inversion radio frequency pulses to the object so as to excite the object to repeatedly generate a plurality of echoes;
   (3) means for phase-encoding and reading out the generated echoes so as to assign one of even-numbered echoes of the generated echoes and odd-numbered echoes thereof only to a central region of a raw data space in the direction of a phase encoding axis thereof and to assign the other of the even-numbered echoes of the generated echoes and odd-numbered echoes thereof only to each of the remaining regions of the raw date apace on both sides of the central region in the direction of the phase encoding axis; and
   means for producing an image of the object on the basis of the assigned echoes to the raw data space.

9. A magnetic resonance imaging apparatus according to claim 8, wherein the means for phase-encoding and read out assigns the even-numbered echoes only to the central region and the odd-numbered echoes only to the remaining regions.

10. A magnetic resonance imaging apparatus according to claim 8, wherein the means for phase-encoding and read out assigns the odd-numbered echoes only to the central region and the even-numbered echoes only to the remaining regions.

11. A magnetic resonance imaging apparatus, which comprises:

(1) means for generating a static magnetic field in which an object is disposed;
(2) means for applying an excitation radio frequency pulse and a plurality of succeeding inversion radio frequency pulses to repeatedly excite the object and to generate a plurality of echoes;
(3) means for phase-encoding and read out the generated echoes so as to assign one of even-numbered echoes thereof only to one of two regions into which the whole of a raw data space is imaginarily divided in the direction of a phase encoding axis thereof and to assign the other of the even-numbered echoes of the generated echoes and the odd-numbered echoes thereof only to the other of the two regions; and
(4) means for producing an image of the object on the basis of the assigned echoes to the raw data space.

* * * * *